United States Patent
Ogawa et al.

(10) Patent No.: US 8,690,392 B2
(45) Date of Patent: Apr. 8, 2014

(54) LIGHT SOURCE UNIT AND LIGHTING SYSTEM

(75) Inventors: Kozo Ogawa, Kanagawa (JP); Kiyoshi Nishimura, Kanagawa (JP); Nobuhiko Betsuda, Kanagawa (JP); Hiroki Tamai, Kanagawa (JP); Akiko Saito, Kanagawa (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 0 days.

(21) Appl. No.: 13/470,593

(22) Filed: May 14, 2012

(65) Prior Publication Data
US 2012/0224372 A1 Sep. 6, 2012

Related U.S. Application Data

(63) Continuation of application No. 12/467,395, filed on May 18, 2009, now Pat. No. 8,197,097.

(30) Foreign Application Priority Data

May 20, 2008 (JP) ................ 2008-131571
Mar. 13, 2009 (JP) ................ 2009-061910

(51) Int. Cl.
*F21V 29/00* (2006.01)
(52) U.S. Cl.
USPC .......................... 362/294; 362/373
(58) Field of Classification Search
USPC .................. 362/218, 294, 373, 547
See application file for complete search history.

(56) References Cited

U.S. PATENT DOCUMENTS

| 4,173,035 A | 10/1979 | Hoyt |
| 5,785,418 A * | 7/1998 | Hochstein ............... 362/373 |
| 7,222,993 B2 * | 5/2007 | Kikuchi et al. .......... 362/294 |
| 7,628,525 B2 | 12/2009 | Lee et al. |
| 2006/0187660 A1 | 8/2006 | Liu |
| 2006/0215408 A1 * | 9/2006 | Lee ......................... 362/294 |
| 2007/0001177 A1 | 1/2007 | Bruning et al. |

(Continued)

FOREIGN PATENT DOCUMENTS

| EP | 1898473 A1 | 3/2008 |
| JP | 2002-299700 A | 10/2002 |

(Continued)

OTHER PUBLICATIONS

Office action for the counterpart Chinese Application No. 200910203410.5 mailed Oct. 8, 2010.

(Continued)

*Primary Examiner* — Y My Quach Lee
(74) *Attorney, Agent, or Firm* — McDermott Will & Emery LLP

(57) ABSTRACT

The light source unit is provided with a substrate and a decorative cover having thermal conductivity. The substrate includes a circuit pattern area, in which a plurality of LED chips are disposed, at the middle part thereof, has thermal conductivity, and transmits heat from the circuit pattern area to an area in the outer circumferential direction thereof. The decorative cover encloses the substrate, is electrically insulated from the circuit pattern area, and is thermally coupled to the surface side of the substrate at the periphery of the circuit pattern area by being face-contacted thereto. Heat of the substrate can be radiated by the decorative cover while securing an electric insulation property with respect to the circuit pattern area.

4 Claims, 11 Drawing Sheets

(56) References Cited

U.S. PATENT DOCUMENTS

| | | |
|---|---|---|
| 2007/0001290 A1 | 1/2007 | Wong et al. |
| 2007/0126020 A1 | 6/2007 | Lin et al. |
| 2007/0200127 A1 | 8/2007 | Andrews et al. |
| 2008/0074884 A1 | 3/2008 | Mok et al. |
| 2009/0027888 A1* | 1/2009 | Yu et al. ................. 362/373 |
| 2009/0101932 A1 | 4/2009 | Chen |
| 2009/0147522 A1* | 6/2009 | Shuai et al. ............. 362/294 |
| 2009/0237929 A1 | 9/2009 | Kuo et al. |
| 2010/0061089 A1 | 3/2010 | Lin et al. |

FOREIGN PATENT DOCUMENTS

| | | |
|---|---|---|
| JP | 2004-095655 A | 3/2004 |
| JP | 2004-221042 A | 8/2004 |
| JP | 2006-147214 A | 6/2006 |
| JP | 2006-228694 A | 8/2006 |
| JP | 2006-261039 A | 9/2006 |
| JP | 2006-351351 A | 12/2006 |
| JP | 2007-220465 A | 8/2007 |
| JP | 2007-258619 A | 10/2007 |
| JP | 2007-273209 A | 10/2007 |
| JP | 2007-317778 A | 12/2007 |
| JP | 2008-034315 A | 2/2008 |
| JP | 2008-108517 A | 5/2008 |
| WO | WO-2008/019504 A1 | 2/2008 |

OTHER PUBLICATIONS

Japanese Office Action with English Translation issued in Japanese Application No. 2009-061910 mailed Nov. 7, 2012.

Japanese Office Action, with English translation thereof, issued in Japanese Application No. 2013-000475 dated Oct. 9, 2013.

* cited by examiner

LIGHT SOURCE UNIT AND LIGHTING SYSTEM

CROSS REFERENCE TO RELATED APPLICATIONS

This application is a continuation application of U.S. patent application Ser. No. 12/467,395 filed on May 18, 2009, which claims priority under 35 U.S.C. §119 to Japanese Patent Application Nos. 2008-131571 and 2009-61910 filed on May 20, 2008 and Mar. 13, 2009, respectively. The contents of these applications are incorporated herein by reference in their entirety.

FIELD OF THE INVENTION

The present invention relates to a light source unit and a lighting system, in which light emitting elements such as LEDs are used.

BACKGROUND OF THE INVENTION

With respect to light emitting elements such as LEDs, an increase in temperature lowers the optical output, varies the characteristics thereof and further adversely influences the service life thereof. Therefore, in a light source unit using light emitting elements, for example, LEDs and EL elements as a light source, it is necessary to prevent the temperature of the light emitting elements from rising for the purpose of improving the service life and various characteristics pertaining to efficiency.

Conventionally, as has been described in, for example, Japanese Laid-Open Patent Publication No. 2004-95655, such a type has been proposed in a light source unit, in which a number of through holes are formed in a matrix so as to prevent the temperature from rising through sufficient radiation of heat of respective LEDs by collectively disposing a plurality of LEDs in a matrix.

However, although such a configuration has been shown which radiates the heat of LEDs and prevents the temperature from rising, the heat-radiating structure, appearance and functions thereof are not satisfactory when actually commercializing the mode as a light source unit and a lighting system.

The present invention has been developed in view of the above-described situations, and it is therefore an object of the invention to provide a light source unit and a lighting system capable of improving the heat-radiating effect and being independently composed as a light source unit, by which diversification is enabled by disposing the light source units in a plurality of desired patterns.

SUMMARY OF THE INVENTION

According to a light source unit of the present invention includes: a substrate having a circuit pattern area, in which a plurality of light emitting elements are disposed, at the middle part thereof, and having thermal conductivity, in which thermal conduction is carried out from the circuit pattern area having the light emitting elements disposed therein to an area in the outer circumferential direction thereof; and a decorative cover having thermal conductivity, for enclosing the substrate, electrically insulated from the circuit pattern area, which is thermally coupled to the surface side of the substrate at the periphery of the circuit pattern area by being face-contacted thereto.

In the present invention, a definition of terms and technical meanings are as follows unless otherwise specified.

The light emitting element is a solid-state light emitting element such as an LED, organic EL, inorganic EL, etc. Although it is preferable that the light emitting elements are disposed in the form of a chip-on-board system and a surface mount system, the disposing system thereof is not specially limited in view of the characteristics of the invention, for example, cannonball type LEDs may be disposed on a substrate. Also, the number of light emitting elements disposed is not specially limited. The circuit pattern area means an area having electric conductivity in which light emitting elements are disposed and electric wiring is provided.

As the substrate, a so-called metallic substrate having thermal conductivity, a ceramic substrate, and a substrate having a copper foil, etc., placed between glass epoxy substrates may be applied. Enclosure of the substrate includes a case where a substrate is covered up that the substrates not viewed from outside without the outer circumference thereof being exposed in a use state of the light source unit, that is, the enclosure has a major purpose of improving the appearance design by enclosing the functional components thereof. Being thermally coupled by being face-contacted to the substrate permits a case where the decorative cover is not only directly contacted to the substrate but also indirectly contacted thereto. For example, it is acceptable that a member having a favorable thermal conductivity and an adhesive agent may intervene between the substrate and the decorative cover.

Thus, since the substrate has thermal conductivity and a decorative cover having thermal conductivity is face-contacted to the surface side of the substrate and thermally coupled thereto, the radiation property of heat is improved as the light source unit, and it is possible to prevent any failure from being brought about due to heat as a single light source unit. Further, heat radiation can be carried out while securing electric insulation from the circuit pattern area.

According to the light source unit of the present invention, the substrate includes at least a thermal conduction layer, an electric insulation layer and a circuit pattern layer, the thermal conduction layer is exposed to the periphery of the circuit pattern area to which the decorative cover is face-contacted and is thermally coupled, and the thermal conduction layer is coupled directly to the decorative cover.

A decorative cover being directly coupled to a thermal conduction layer does not impede that, for example, an adhesive, etc., intervenes between the thermal conduction layer and the decorative cover.

Thus, since the decorative cover is directly coupled to the thermal conduction layer of a substrate, thermal conduction can be efficiently carried out, thereby ensuring the radiation of heat.

According to a lighting system of the present invention, the decorative covers of a plurality of light source units are disposed so as to form a heat-radiating path with spacing therebetween.

Thus, since the decorative covers of a plurality of light source units are provided with spacing therebetween so as to make use of high heat radiation property of a single light source unit, it is possible to prevent any failure due to heat from occurring frequently even if a plurality of light source units are combined and unitized. In addition, the commercial value can be improved since the degree of freedom in combination of the light source units can be expanded.

BRIEF DESCRIPTION OF THE DRAWINGS

FIG. 3(a) is a sectional view of the light source unit, and

FIG. 3(b) is a sectional view of a substrate.

FIG. 7(a) is a sectional view of the light source unit, and FIG. 7(b) is a sectional view of a substrate.

FIG. 8(a) is a sectional view of a light source unit of such a type that is not provided with any reflector, and FIG. 8(b) is a sectional view of a light source unit of such a type that is not provided with any flange of a decorative cover.

DETAILED DESCRIPTION OF THE PREFERRED EMBODIMENT

Figure 1:
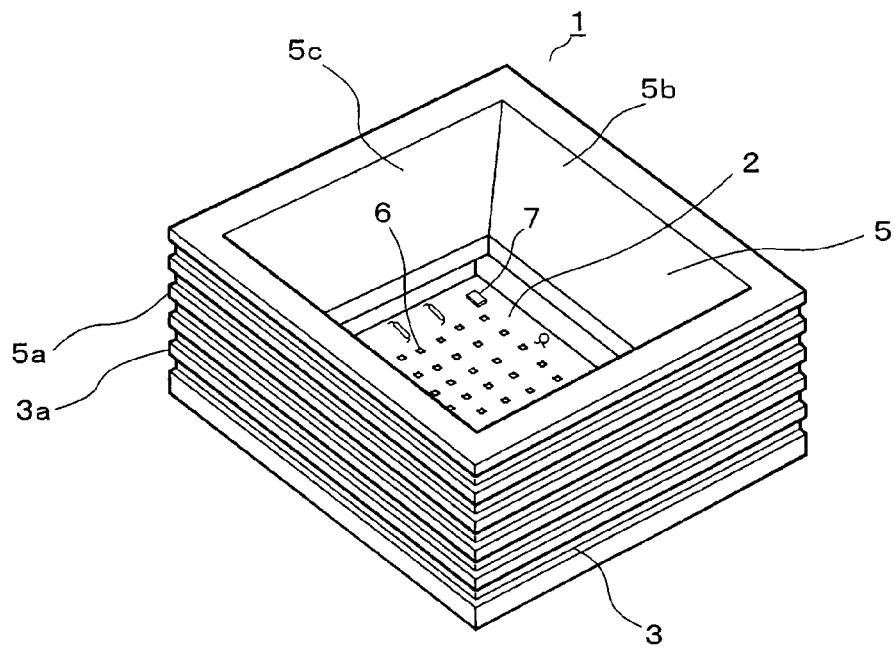
FIG. 1 is a perspective view of a light source unit according to Embodiment 1 of the present invention.

Hereinafter, a description is given of a light source unit according to Embodiment 1 of the present invention with reference to FIG. 1 through FIG. 3. FIG. 1 is a perspective view of the light source unit, FIG. 2 is a plan view of the light source unit, and FIG. 3(a) is a sectional view of the light source unit, and FIG. 3(b) is a sectional view of a substrate.

Figure 2:
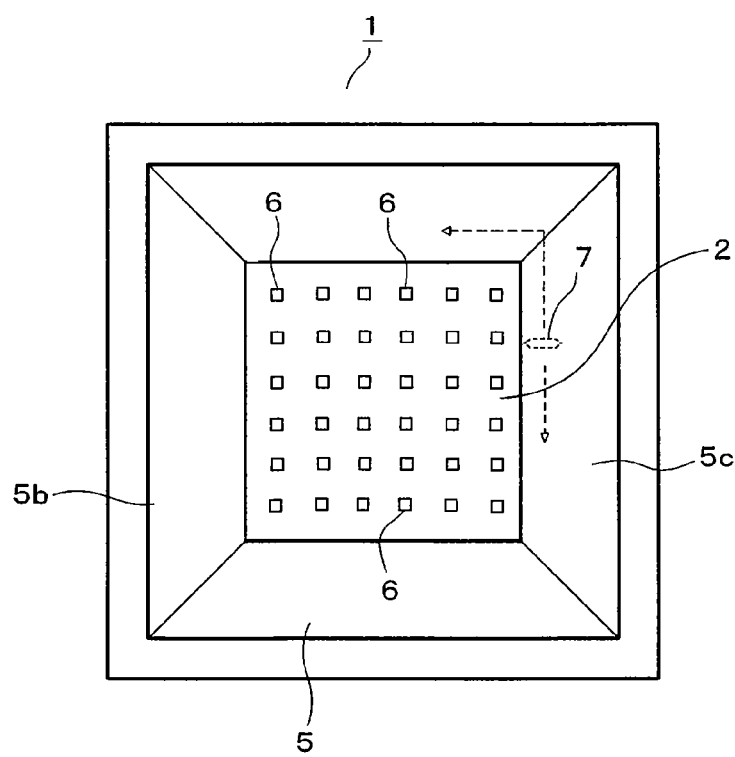
FIG. 2 is a plan view of the same light source unit.

In FIG. 1 and FIG. 2, a light source unit 1 is formed to be roughly a rectangular parallelepiped in appearance, the size of which is approximately 70 mm for the longitudinal and lateral dimension and approximately 25 mm for the height, and is provided with a substrate 2 on which a plurality of light emitting elements that become light sources are disposed, a decorative cover 3, a heat-radiating member 4 and a reflector 5.

LED chips 6 operating as a plurality of light emitting elements are mounted on the substrate 2 by the chip-on-board system. That is, such a structure is adopted in which a plurality of LED chips 6 are disposed on the surface of the substrate 2 in the form of a matrix with predetermined spacing, and the surface thereof is coated with a coating material. In addition, the number of the LED chips 6 disposed thereon may be appropriately determined in accordance with the product specification and design.

Figure 3:
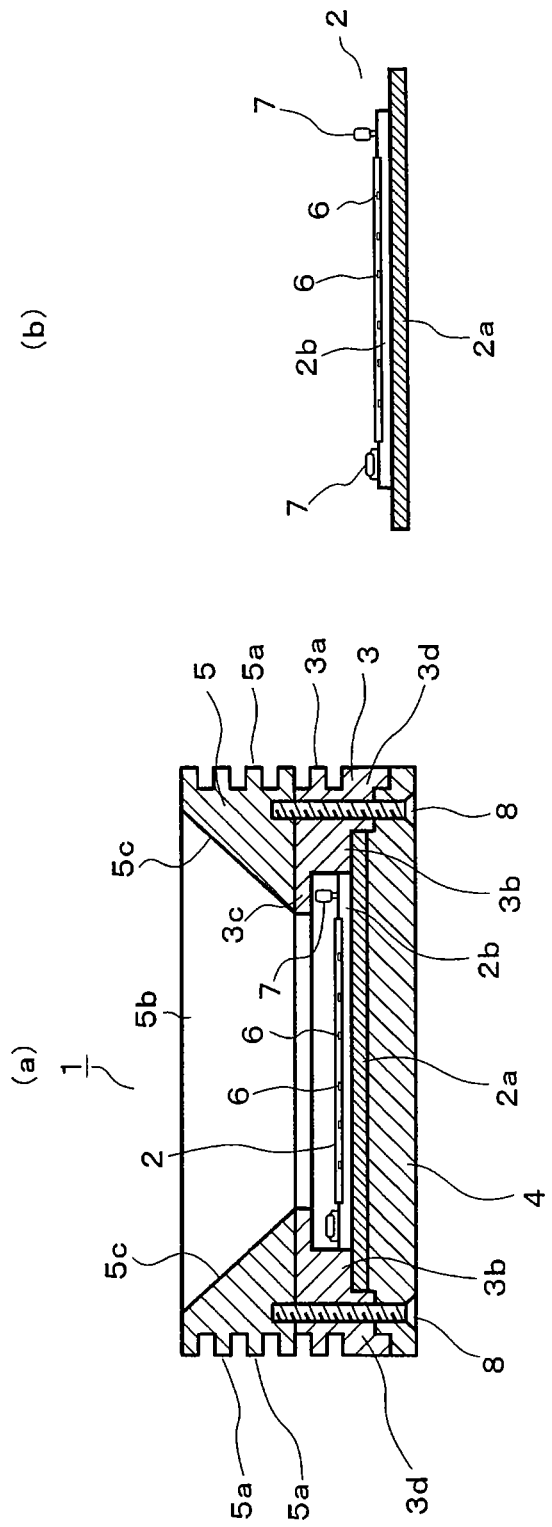
FIG. 3 shows the same light source unit.

As shown in FIG. 3, the substrate 2 includes a base plate 2a, an electric insulation layer 2b and a circuit pattern layer (not illustrated). The base plate 2a is made of metal, for example, aluminum which has favorable thermal conductivity and is excellent in a heat radiation property and is formed to be a roughly square flat plate. At the middle part of the surface being one side of the base plate 2a, an electric insulation layer 2b made of synthetic resin composed of epoxy resin, etc., is formed, and a circuit pattern layer is formed on the electric insulation layer 2b. The circuit pattern layer is formed of a material having electric conductivity such as a copper foil in order to supply power from a power source to the LED chips 6. Therefore, a circuit pattern area in which a plurality of LED chips 6 are disposed is formed at the middle part of the surface of the substrate 2. Also, the base plate 2a may be composed of metal or an insulative material. If an insulative material is used, a ceramic material or a synthetic resin material, which is comparatively favorable in heat-radiating property and is excellent in durability, may be applicable. Where the synthetic resin material is used, for example, the material may be formed of a glass epoxy resin, etc.

A lighting circuit is disposed at the peripheral side of the substrate 2, which is the surface side on which the LED chips 6 of the substrate 2 are mounted, and a lighting circuit component 7 of the lighting circuit is mounted thereon. The lighting circuit component 7 is a component such as a capacitor, a resistor element, and a switching element, which controls lighting of the LED chips 6.

Further, the decorative cover 3 composes the appearance of the light source unit 1, for example, which is made of aluminum, and forms roughly a rectangular parallelepiped and is short-tubular. A heat-radiating fin 3a is integrally formed on the entire periphery of the outer circumferential surface of the decorative cover 3 in order to increase the heat-radiating area. The heat-radiating fin 3a is formed in the lateral direction, that is, in the horizontal direction. Therefore, it forms a groove in the horizontal direction.

The outer circumferential surface of the decorative cover 3 is baking finished with a white melamine resin-based paint. And, a fitting part 3b that is face-contacted to at least the surface side of the substrate 2, that is, the peripheral part at the surface side of the base plate 2a of the substrate 2, is formed on the inner circumferential surface of the decorative cover 3. Further, a flange 3c oriented in the inner circumferential direction is formed at the opening end side of the decorative cover 3. Still further, the stepwise part 3d which is brought into contact with the side part of the base plate 2a and the peripheral part of the heat-radiating member 4 are formed on the inner circumferential surface of the decorative cover 3.

In addition, the heat-radiating member 4 is made of, for example, aluminum, and is formed to be a roughly square flat plate. The heat-radiating member 4 is composed so as to be face-contacted to the rear side of the substrate 2, that is, to the rear side of the base plate 2a of the substrate 2. Also, it is sufficient that the face-contacting is not only entire-face contacting but also partial-face contacting.

Further, the reflector 5 is made of, for example, aluminum, and is formed to be a roughly rectangular parallelepiped and to be tubular. A plurality of heat-radiating fins 5a are integrally formed on the entire periphery of the outer circumferential surface of the reflector 5 in order to increase the heat-radiating area. The heat-radiating fin 5a is formed in the horizontal direction so as to be continued to the heat-radiating fin 3a of the decorative cover 3, therefore, it forms a groove in the horizontal direction. On the other hand, an inclined reflection surface 5c, which is opened and widened in the direction of the irradiation opening portion 5b, is formed on the inner circumferential surface of the reflector 5, and the inclination angle of the reflection surface 5c is adjusted in order to obtain a predetermined light distribution property and to prevent glare. In addition, the inner and outer circumferential surface of the reflector 5 are baking-finished by a white melamine resin-based paint.

Further, the material of the decorative cover 3, heat-radiating member 4 and reflector 5 is not limited to aluminum, but a metallic material or a resin material, which is favorable in thermal conductivity, may be used.

Next, referring to FIG. 3, a description is given of an assembled state of the substrate 2, the decorative cover 3, the heat-radiating member 4 and the reflector 5.

The rear side of the base plate 2a of the substrate 2 is disposed on the upper surface of the heat-radiating member 4 so as to be face-contacted and thermally coupled with each other. Also, an adhesive agent is caused to intervene between the upper surface of the heat-radiating member 4 and the rear side of the base plate 2a and both thereof may be coupled together. In this case, it is preferable that, as an adhesive agent, a material having favorable thermal conductivity, in which a metal oxide, etc., is blended along with a silicone resin-based adhesive agent, is used. Further, the decorative cover 3 is disposed so that the fitting part 3b is face-contacted to the surface side of the base plate 2a of the substrate 2 and is thermally coupled thereto, and simultaneously is disposed so that the stepwise part 3d is brought into contact with the side part of the base plate 2a and the circumferential part of the heat-radiating member 4. In addition, the lighting circuit component 7 mounted at the peripheral side of the substrate 2 is covered so as to be covered up with the flange 3c. Also, the reflector 5 is disposed to be face-contacted to the upper surface of the decorative cover 3.

The heat-radiating member 4, the decorative cover 3 and the reflector 5 are altogether tightened and coupled to each other by means of screws 8 screwed from the rear side of the heat-radiating member 4 into the screw through holes formed therein. In this state, the substrate 2 will be placed and fixed between the heat-radiating member 4 and the decorative cover 3. Also, the decorative cover 3 covers the substrate 2 so as to enclose the same, wherein the outer circumference of the substrate 2 is difficult to view from the outside, and functions for improving the appearance design as the light source unit 1.

A description is given of the actions of the light source unit 1 constructed as described above.

As electricity is given to the light source unit 1, power is then supplied to the substrate 2 to cause the lighting circuit to be operated, wherein the LED chips 6 emit light. Most of the light emitted from the LED chips 6 passes through the opening end side of the decorative cover 3 and is irradiated directly forward from the irradiation opening portion 5b of the reflector 5, wherein a part of the light is reflected by the reflection surface 5c of the reflector 5 and irradiated forward. Herein, since the lighting circuit component 7 is covered by the flange 3c, any difference between brightness and darkness is not sensed between a light emitting portion where the LED chips 6 are disposed and a non-light emitting portion where the lighting circuit component 7 is disposed when being viewed from the front. Therefore, a visually favorable design can be brought about.

On the other hand, heat generated from the LED chips 6 in line with lighting of the LED chips 6 is mainly transmitted from a roughly entire surface of the rear side of the base plate 2a of the substrate 2 to the heat-radiating member 4. Further, the corresponding heat is thermally transmitted for heat radiation from the surface side of the base plate 2a to the decorative cover 3 via the fitting part 3b of the decorative cover 3. Thus, since heat is transmitted through face-contacting from both the surface side and the rear side of the substrate 2 and is radiated, the effect of heat radiation can be increased, wherein it becomes possible to prevent the temperature of the substrate 2 from rising. In other words, since heat is radiated from both the surface side and the rear side of the substrate 2, the heat radiation function can be thereby secured, heat radiation can be completed in the light source unit 1. In addition, since the decorative cover 3 is brought into contact with the side part of the base plate 2a and the peripheral part of the heat-radiating member 4, thermal conduction is carried out at this portion, and further, thermal conduction from the decorative cover 3 to the reflector 5 is carried out, wherein heat radiation is accelerated. In addition, since heat-radiating fins 3a and 5a are formed on the decorative cover 3 and the reflector 5 in order to increase the surface area of the outer circumferential surface, heat radiation can be efficiently carried out here. Thus, since the respective members are thermally coupled to each other, the temperature of the substrate 2 can be prevented from rising by means of the above-described thermal conduction channels and heat radiation. Further, simultaneously, it is possible to radiate heat generated from the lighting circuit.

As described above, according to the present embodiment, since heat is radiated from both the surface side and the rear side of the substrate 2, the heat-radiating function can thereby be secured, and the light source unit 1 has a high heat radiation property as a single unit, wherein it is possible to prevent the light source unit 1 from being subjected to any failure resulting from heat as a single unit. Also, it becomes possible to complete heat radiation as a single unit of the light source unit 1, wherein the light source unit 1 can be independently composed. Since the decorative cover 3 is brought into contact with the side part of the substrate 2 and the peripheral part of the heat-radiating member 4, heat radiation can be accelerated at this portion. Further, heat can be efficiently radiated by thermal conduction from the decorative cover 3 to the reflector 5 and by the heat-radiating fins 3a and 5a. Still further, since the lighting circuit component 7 is covered by the flange 3c of the decorative cover 3, a visually favorable design can be brought about.

Further, the reflector 5 may be formed of ABS resin, etc. Also, in the mode of the present embodiment, a description was given of such a type which is provided with the reflector 5. It is not requisite that the light source unit 1 according to the present invention includes the reflector 5. The reflector 5 may be provided as necessary. Further, it is not requisite that the lighting circuit component 7 mounted at the peripheral side of the substrate 2 is covered by the flange 3c. Also, the lighting circuit may permit that the lighting circuit is sealed and disposed in the electric insulation layer 2b of the substrate 2 and is provided outside the light source unit 1. Further, in the present embodiment, although a description was given of the configuration in which the fitting part 3b of the decorative cover 3 is face-contacted to the surface side of the base plate 2a of the substrate 2, such a configuration may be permitted in which the fitting part 3b is face-contacted with the electric insulation layer 2b of the substrate 2 and heat radiation is carried out. In summary, it is sufficient that the fitting part 3b is face-contacted with the surface side of the substrate 2 to enable thermal conduction and heat radiation.

Figure 4:
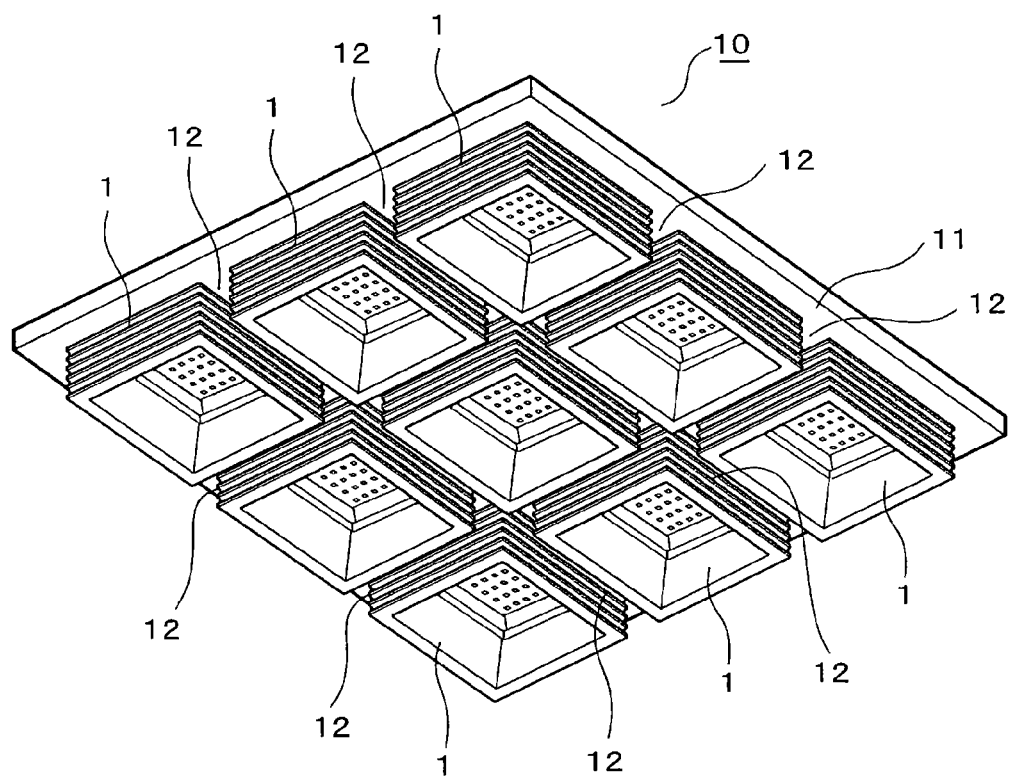
FIG. 4 is a perspective view showing a lighting system using the same light source units.
Figure 5:
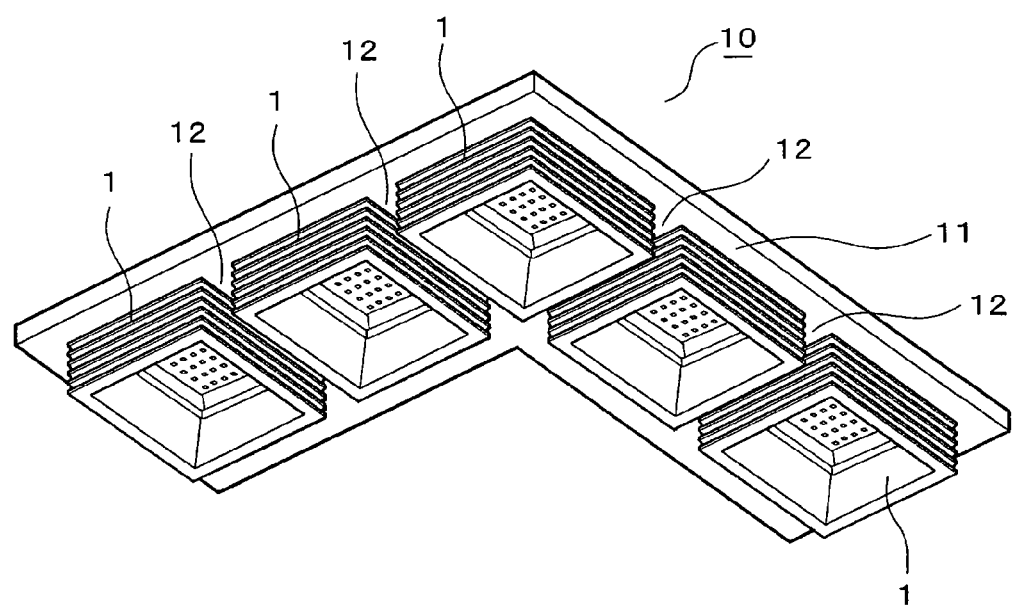
FIG. 5 is a perspective view showing another example of the lighting system using the same light source units.

Next, referring to the perspective views of FIG. 4 and FIG. 5, a description is given of a lighting system 10 using a plurality of light source units 1. The lighting system 10 shown in FIG. 4 and FIG. 5, respectively, is a so-called base lighting system that is attached to a ceiling surface and used thereon.

The lighting system 10 shown in FIG. 4 includes a base 11 and a plurality of light source units 1 disposed on the base 11. The base 11 is made of, for example, aluminum, and is formed to be a roughly square flat plate one side of which is approximately 250 mm long. The light source units 1 are disposed in the form of a matrix so that nine units are provided with three units located in the lengthwise direction and three units located in the widthwise direction on the surface of the base with predetermined spacing (approximately 10 mm) therebetween.

The lighting system 10 shown in FIG. 5 is such that the number of light source units 1 and the disposing manner are changed with respect to the lighting system 10 shown in FIG. 4. Five light source units 1 are disposed with predetermined spacing (approximately 10 mm) on the surface of the base 11 bent at a right angle.

Also, the material of the base 11 is not limited to aluminum, wherein a metallic material or a resin material, etc., which has favorable thermal conductivity, may be used. Further, when composing the lighting system 10, the light source units 1 may be disposed on the ceiling surface by direct mounting without using the base 11. In this case, an aggregate of a plurality of light source units 1 will compose the lighting system 10.

In the lighting system 10, since the respective light source units 1 are disposed with predetermined spacing therebetween while heat is radiated from the respective light source units 1, a heat radiation path 12 is formed by making the spacing continuous. In detail, the spacing between the respective light source units 1 is made continuous to form the heat radiation path 12. Therefore, flows of heat-radiating air streams along the heat radiation path 12 are accelerated not only by heat radiation of individual light source units 1 but also by the heat radiation path 12, wherein the effect of heat radiation can be further increased. In addition, since the heat-radiating fins 3a and 5a are formed in the horizontal direction with respect to the surface of the base 11, flows of the heat-radiating air stream can be further promoted by the configuration.

Thus, according to the present embodiment, since the light source unit 1 has a high heat radiation property as a single unit, it is possible to prevent the light source unit 1 from being subjected to any failure due to heat as a single unit, and since heat radiation as a single unit of the light source unit 1 can be completed, and the light source unit 1 can be independently composed, a plurality of light source units 1 may be optionally disposed, as shown in FIG. 4 and FIG. 5, on the base 11 or on the ceiling surface, etc., and commonization of the light source units 1 is enabled. Therefore, simplification in heat radiation design can be expected when designing a lighting system of different types. Furthermore, such a configuration may be available, in which several types of bases 11 having different sizes are prepared, light source units 1 are disposed with the quantity thereof changed corresponding to these bases 11 depending on the application, thereby enabling to attempt to diversify the configuration and to bring about various types thereof, wherein the degree of freedom in combination can be expanded, and improvement in the commercial value can be expected. In addition, based on the configuration of the light source units 1 and the manner of disposing the light source units 1 onto the base 11, the temperature of the substrate 2 having the LED chips 6 disposed thereon can be effectively prevented from rising, wherein a number of light source units 1 can be disposed on the base 11, so that a lighting system 10 having high output can be easily brought about.

Figure 6:
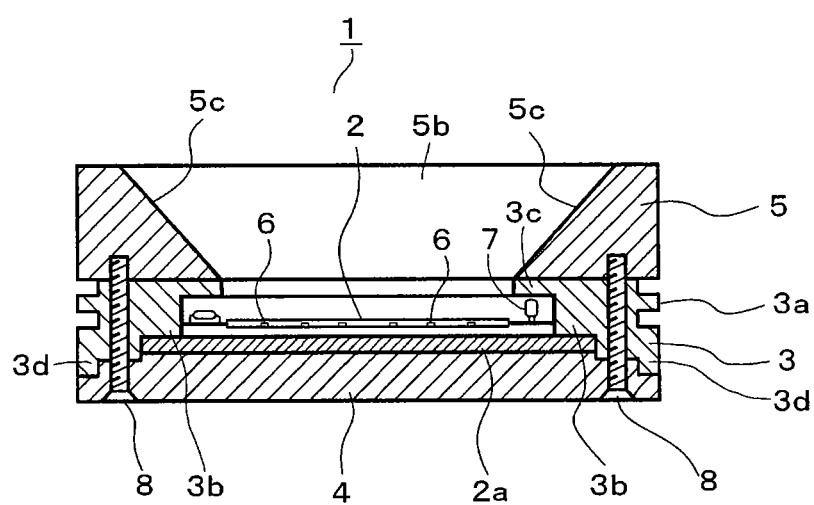
FIG. 6 is a sectional view of a light source unit according to Embodiment 2 of the present invention.

Next, referring to FIG. 6, a description is given of a light source unit according to Embodiment 2 of the present invention. FIG. 6 is a sectional view of the light source unit.

Also, in the following respective embodiments, components that are identical to or equivalent to those of Embodiment 1 are given the same reference numerals, and overlapping description thereof is omitted.

In Embodiment 2, the reflector 5 is formed of synthetic resin such as ABS resin, and is not provided with heat-radiating fins. And, the reflection surface 5c is provided with chrome plating to increase the reflection efficiency. Therefore, heat of the substrate 2 is mainly transmitted from roughly the entire surface of the rear side of the base plate 2a of the substrate 2 to the heat-radiating member 4, and is further radiated from the surface side of the base plate 2a via the fitting part 3b of the decorative cover 3.

As described above, according to Embodiment 2, heat can be radiated from both the surface and the rear side of the substrate 2, heat radiation can be completed as a single unit of the light source unit 1, wherein effects similar to those of Embodiment 1 can be brought about.

Figure 7:
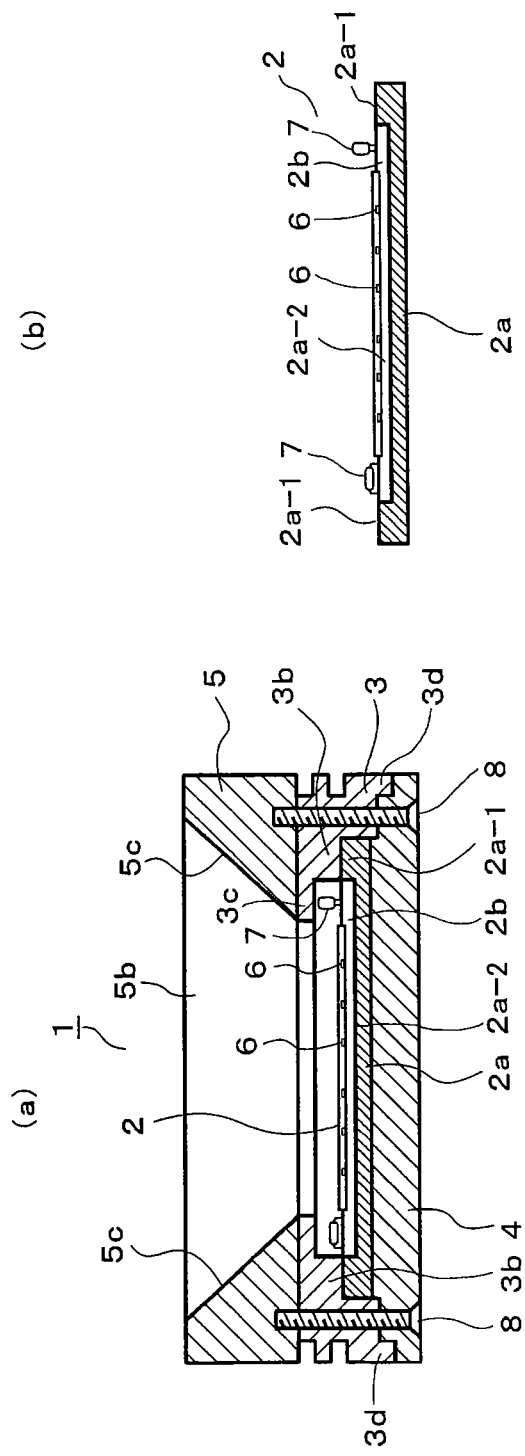
FIG. 7 shows a light source unit according to Embodiment 3 of the present invention.

Next, with reference to FIG. 7, a description is given of a light source unit according to Embodiment 3 of the present invention. FIG. 7(a) is a sectional view of the light source unit, and FIG. 7(b) is a sectional view of a substrate.

In Embodiment 3, the reflector 5 is formed of synthetic resin such as ABS resin, and Embodiment 3 differs from Embodiment 1 in view of the configuration of the substrate 2. Although the substrate 2 is composed of the base plate 2a, the electric insulation layer 2b and the circuit pattern layer, an erect wall 2a-1 is formed at the periphery of the base plate 2a. Therefore, a recessed portion 2a-2 is formed at the middle part of the base plate 2a by the erect wall 2a-1, and the electric insulation layer 2b is formed in the recessed portion 2a-2. Such a substrate 2 is applicable to the light source unit 1. In this case, the fitting part 3b of the decorative cover 3 is brought into contact with the upper surface of the erect wall 2a-1 to carry out thermal conduction.

As described above, since heat can be radiated from both the surface and the rear side of the substrate 2 in Embodiment 3, heat radiation can be completed as a single unit of the light source unit 1, wherein effects similar to those of Embodiment 1 can be brought about.

Figure 8:
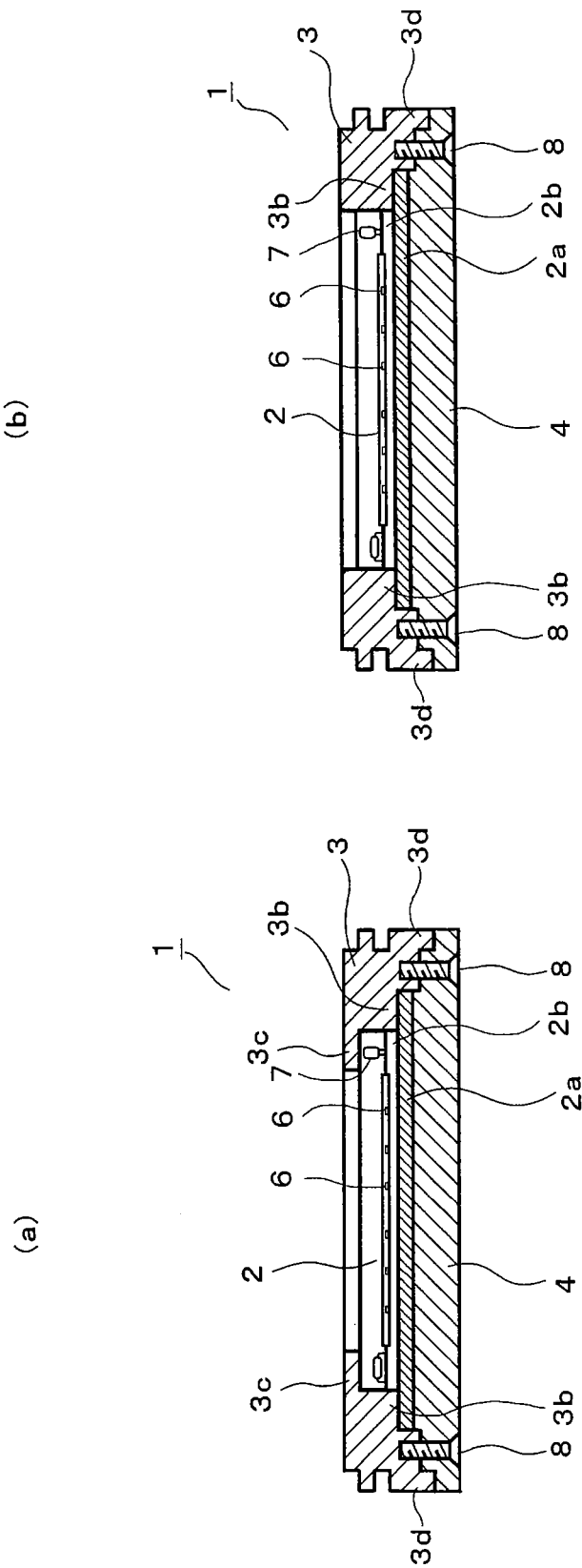
FIG. 8 shows a light source unit according to Embodiment 4.

Next, referring to FIG. 8, a description is given of a light source unit 1 according to Embodiment 4 of the present invention. FIG. 8(a) is a sectional view of a light source unit of such a type not having any reflector incorporated therein, and FIG. 8(b) is a sectional view of a light source unit of such a type not having any flange of the decorative cover incorporated therein.

As shown in FIG. 8(a), where no reflector 5 is provided, the light source unit 1 can be established. Also, as shown in FIG. 8(b), where the decorative cover 3 is not provided with any flange 3c, the light source unit 1 can be established. It is a matter of course that there is no hindrance with respect to appropriate addition of the reflector 5 and the flange 3c.

As described above, since heat is radiated from both the surface and the rear side of the substrate 2 in Embodiment 4, heat radiation can be completed as a single unit of the light source unit 1, wherein effects similar to those of Embodiment 1 can be brought about.

Figure 9:
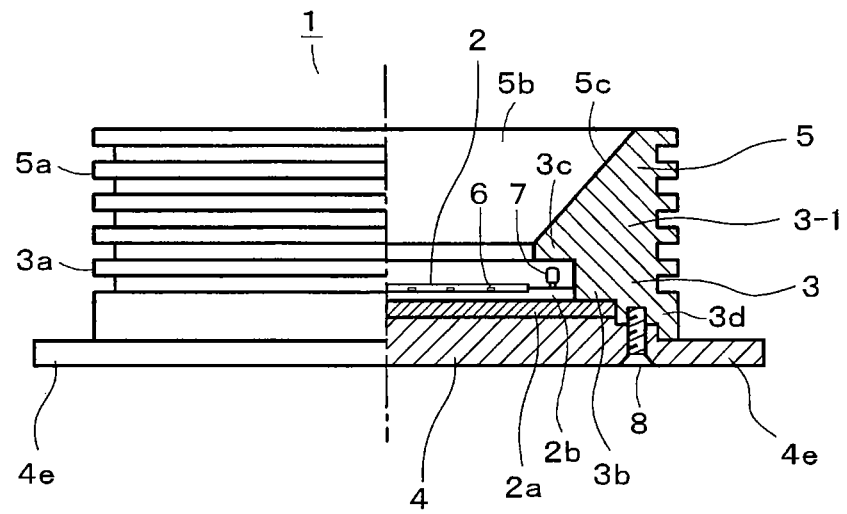
FIG. 9 is a side elevational view of a light source unit according to Embodiment 5 of the present invention with the right half thereof shown as a sectional view.
Figure 10:
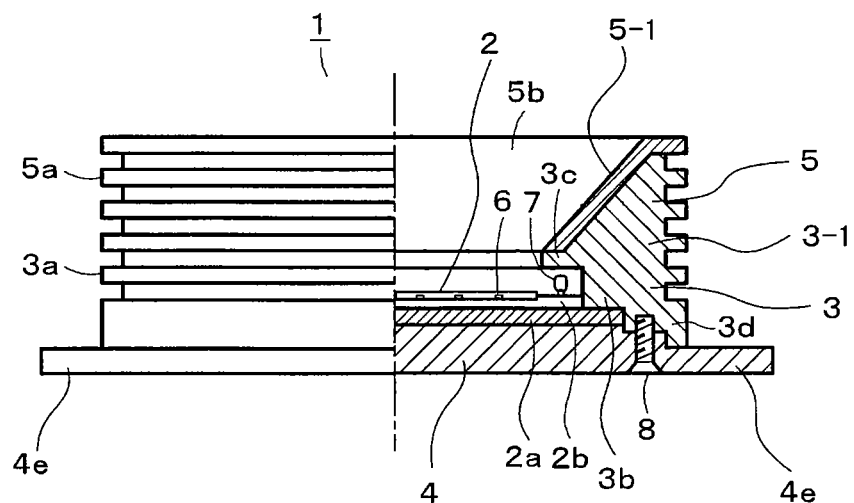
FIG. 10 is a side elevational view of the light source unit showing another example according to Embodiment 5 of the present invention with the right half thereof shown as a sectional view.

Next, referring to FIG. 9 and FIG. 10, a description is given of a light source unit according to Embodiment 5 of the present invention. FIG. 9 and FIG. 10 are side elevational views showing the right half of a light source unit as a section.

A light source unit 1 shown in FIG. 9 is composed so that the decorative cover 3 and the reflector 5 are integrally composed of aluminum, etc., having thermal conductivity. In other words, the decorative cover 3-1 concurrently functions as the reflector 5. Also, an extension portion 4e is formed by extending the outer circumferential portion of the heat-radiating member 4. The extension portion 4e can be utilized to attach the light source unit 1 to the base 11, etc.

A light source unit 1 shown in FIG. 10 is such that a reflection plate 5-1 is attached to the reflector 5 along the inclination thereof. The reflection plate 5-1 is made of ABS resin, and the reflection surface of the surface is plated with chrome in order to increase the reflection efficiency.

As described above, since heat is radiated from both the surface and the rear side of the substrate 2 in Embodiment 5, heat radiation can be completed as a single unit of the light source unit 1, wherein effects similar to those of Embodiment 1 can be brought about.

Figure 11:
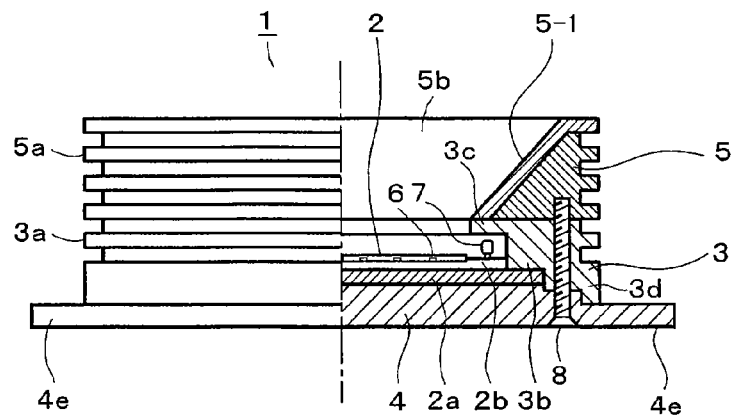
FIG. 11 is a side elevational view of the light source unit according to Embodiment 6 of the present invention with the right half thereof shown as a sectional view.
Figure 12:
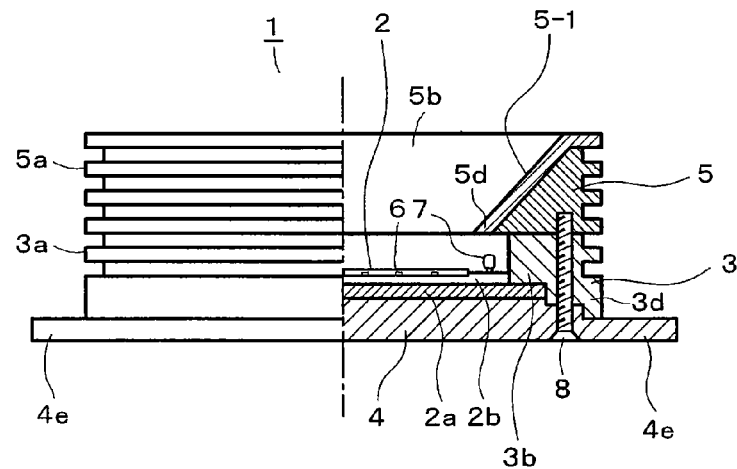
FIG. 12 is a side elevational view of the light source unit showing another example according to Embodiment 6 of the present invention with the right half thereof shown as a sectional view.

Next, referring to FIG. 11 and FIG. 12, a description is given of a light source unit according to Embodiment 6 of the present invention. FIG. 11 and FIG. 12 are side elevational views showing the right half of the light source unit as a section.

Embodiment 6 is such that a decorative cover 3 made of aluminum having thermal conductivity and a reflector 5 are composed to be separate from each other, and a reflection plate 5-1 is attached to the reflector 5 along the inclination thereof.

Although the light source unit 1 shown in FIG. 11 has a flange 3c mounted at the decorative cover 3, the light source unit 1 shown in FIG. 12 is not provided with any flange 3c at the decorative cover 3, in which the irradiation opening portion 5b of the reflector 5 and the end edge 5d at the opposite side thereof assume a role of a flange.

As described above, since heat can be radiated from both the surface and the rear side of the substrate 2 in Embodiment 6, heat radiation can be completed as a single unit of the light source unit 1, wherein effects similar to those of Embodiment 1 can be brought about.

Figure 13:
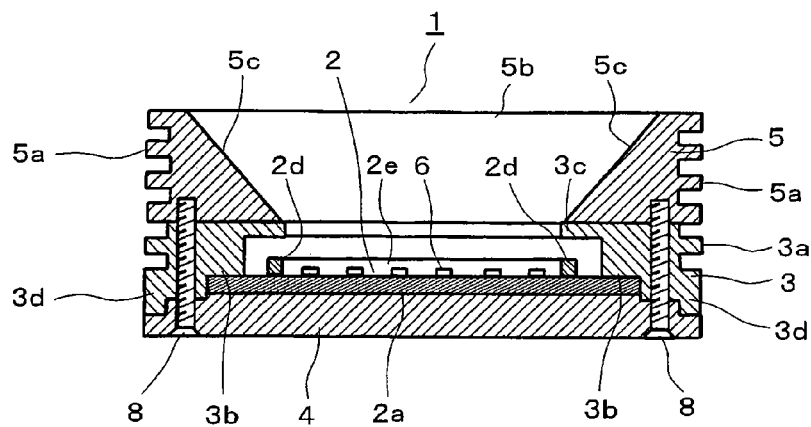
FIG. 13 is a sectional view of a light source unit according to Embodiment 7 of the present invention.
Figure 14:
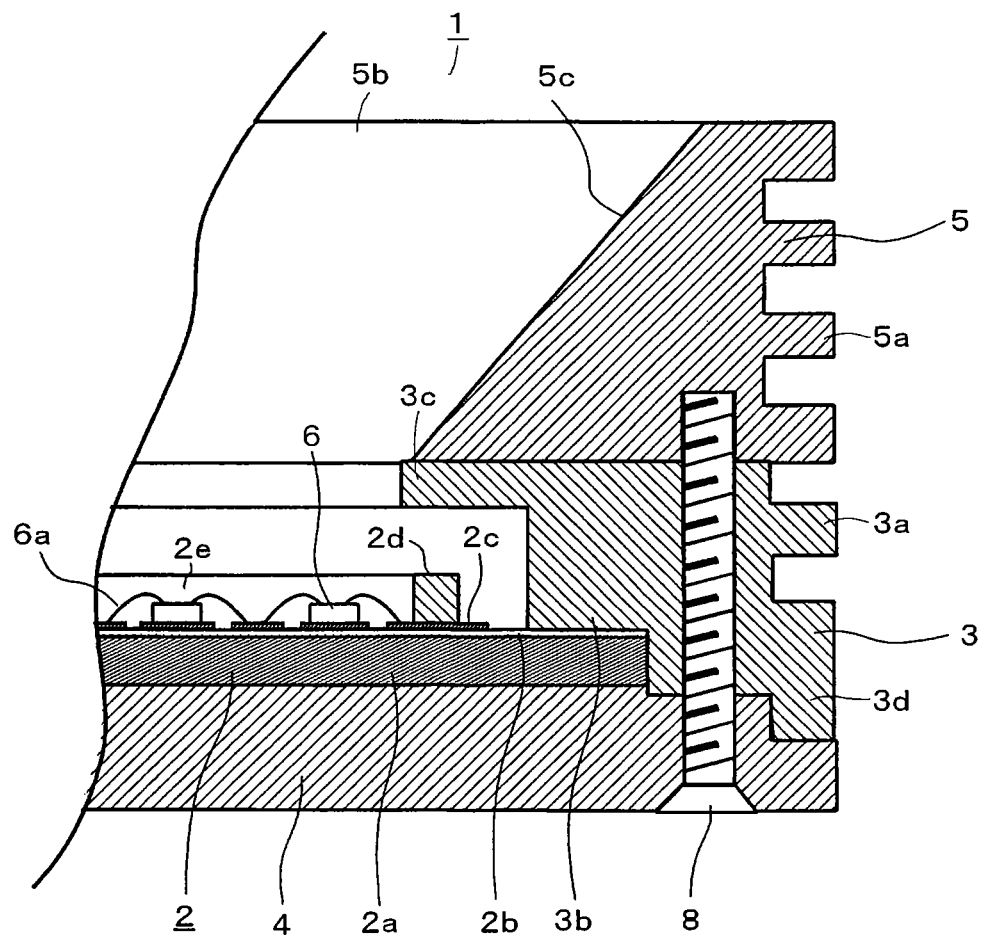
FIG. 14 is a partially enlarged sectional view of a light source unit according to Embodiment 7 of the present invention.
Figure 15:
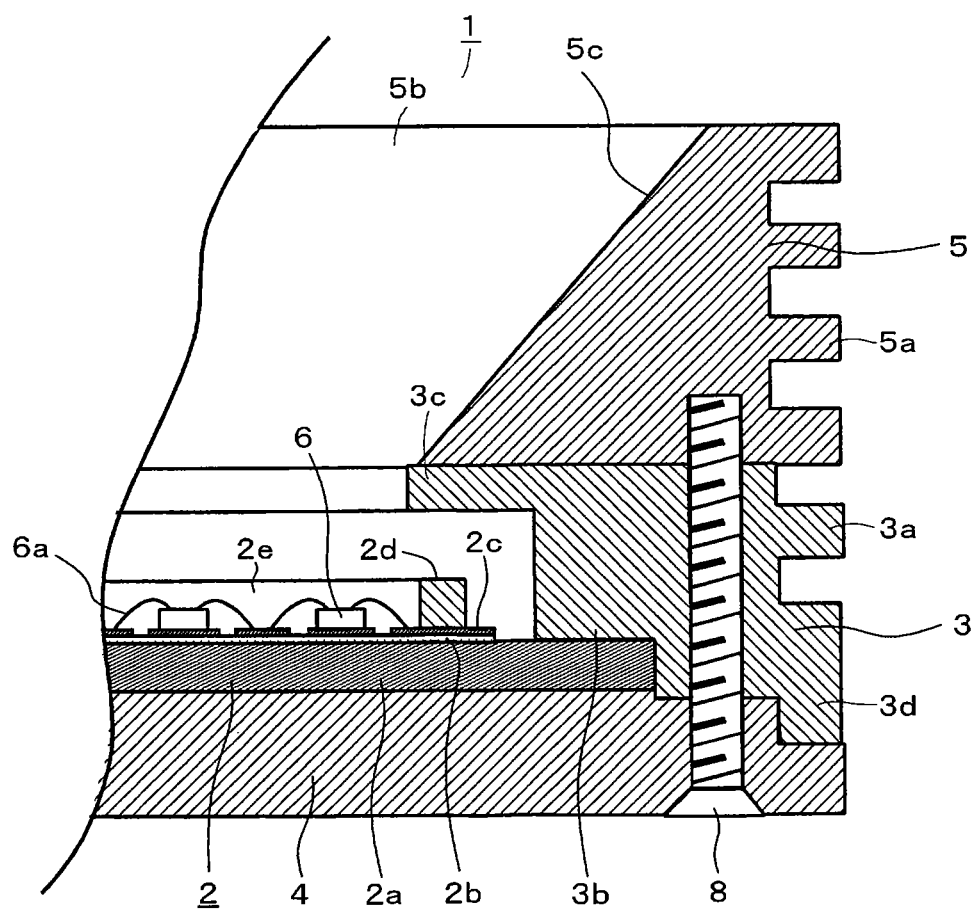
FIG. 15 is a partially enlarged sectional view of a light source unit, which shows another example according to Embodiment 7 of the present invention. And, FIG. 16 is a partially enlarged sectional view of a light source unit according to Embodiment 8 of the present invention.

Next, referring to FIG. 13 through FIG. 15, a description is given of a light source unit according to Embodiment 7 of the present invention while showing a detailed structure of the substrate. FIG. 13 is a sectional view showing the light source unit, FIG. 14 is a sectional view showing one example in which a part of the light source unit is enlarged, and FIG. 15 is a sectional view showing another example in which a part of the light source unit is enlarged.

Embodiment 7 is basically similar to the light source unit 1 according to Embodiment 1.

As shown in FIG. 13, a plurality of LED chips 6 are mounted on the substrate 2 in the form of a matrix by the chip-on-board system. The substrate 2 is composed of a base plate 2a operating as a thermal conduction layer, an electric insulation layer 2b and a circuit pattern layer, and a resin-made frame body 2d is fixed on the surface of the substrate 2 along the periphery thereof.

A sealing member 2e being a coating material is formed in the resin-made frame body 2d on which a plurality of LED chips 6 are disposed. The sealing member 2e shuts out atmospheric air and seals the LED chips 6, etc., in order to protect the LED chips 6, etc., and a thermally-hardening type epoxy-based or silicone-based transparent or semi-transparent light-permeable resin may be used as the sealing member 2e. And, such a type in which a fluorescent substance is blended with these resins as necessary may be used. A fluorescent substance that is excited by emission of blue light of the LED chips 6 and emits yellow light is used in the present embodiment. In this case, white light is radiated since yellow light and blue light are synthesized.

The fitting part 3b that is face-contacted to at least the surface side of the substrate 2 is formed on the inner circumferential side of the decorative cover 3. The fitting part 3b is electrically insulated and face-contacted to the area where the LED chips 6 at the substrate 2 are electrically connected and disposed, in other words, to the periphery of the circuit pattern area.

And, in the light source unit 1 (Embodiment 1) shown in FIG. 14, the base plate 2a operating as a thermal conduction layer is composed of an aluminum-made flat plate that is favorable in thermal conductivity and excellent in heat radiation property. The plate thickness dimension is approximately 1 mm. An electric insulation layer 2b made of synthetic resin composed of epoxy resin, etc., is formed with a thickness of approximately 80 μm on the surface of the base plate 2a. Further, the circuit pattern layer 2c that composes a circuit pattern area for wiring of the LED chips 6 is formed at the middle part on the electric insulation layer 2b. That is, the circuit pattern layer 2c is formed with the periphery remaining. The reason why the circuit pattern layer 2c is formed with the periphery remaining is that the fitting part 3b of the decorative cover 3 is brought into contact with the substrate 2 while securing insulation from the circuit pattern area. The circuit pattern layer 2c is formed by plating Ni and Ag on a conductive material such as a copper foil to supply power from a power source to the LED chips 6. In detail, the thickness dimension of the copper foil, etc., is approximately 35 μm, an Ni plating process is given thereon with a thickness of 3.0 through 5 μm, and an Ag plating process is further given thereon with a thickness of 0.3 through 0.7 μm.

The LED chips 6 are adhered to the circuit pattern layer 2c of the substrate 2 by using a silicone resin-based adhesive agent. The LED chips 6 are, for example, InGaN-based elements, wherein a light-emitting layer is laminated on a light-permeable sapphire element substrate, and the light-emitting layer is formed by laminating an n-type nitride semiconductor layer, an InGaN light-emitting layer and a p-type nitride semiconductor layer one after another. And, an electrode to flow an electric current to the light-emitting layer is composed of a positive side electrode formed of a p-type electrode pad on the p-type nitride semiconductor layer and a negative side electrode formed of an n-type electrode pad on the n-type nitride semiconductor layer. These electrodes are electrically connected to the circuit pattern layer 2c by means of a bonding wire 6a. The bonding wire 6a is composed of a gold wire, and is connected via a bump, which is mainly composed of Au, in order to improve the mounting strength and to reduce damage to the LED chips 6.

According to such a configuration, the fitting part 3b of the decorative cover 3 is brought into contact with the periphery of the circuit pattern area on the surface side of the substrate 2. In detail, the fitting part 3b is thermally coupled to the periphery of the base plate 2a via the electric insulation layer 2b. Therefore, as in the respective embodiments described above, heat generated from a plurality of LED chips 6 is mainly transmitted from roughly the entire surface of the rear side of the base plate 2a of the substrate 2 to the heat-radiating member 4, and the corresponding heat is further diffused from the circuit pattern area at the middle part, in which the LED chips 6 are disposed, to the area in the outer circumferential direction and is transmitted to the periphery. Further, the heat is thermally transmitted to the decorative cover 3 via the fitting part 3b of the decorative cover 3 and is then radiated. Thus, since the heat is radiated from both the surface and the rear side of the substrate 2, the effect of heat radiation can be improved as the light source unit 1. Also, in this case, since the fitting part 3b of the decorative cover 3 is brought into contact with the periphery of the substrate 2, it becomes possible to easily secure an electric insulation property with respect to the circuit pattern area.

As described above, according to the light source unit 1 (Mode 1) shown in FIG. 14, since effects similar to those of Embodiment 1 can be brought about, the effect of heat radiation can be enhanced while securing an electric insulation property with the circuit pattern area.

In addition, the light source unit 1 (Mode 2) shown in FIG. 15 is such that the electric insulation layer 2b and the circuit pattern layer 2c composing the circuit pattern area are formed on the surface of the base plate 2a of the substrate 2 with the periphery thereof remaining. Therefore, the periphery of the base plate 2a is exposed to the surface side, and the fitting part 3b of the decorative cover 3 is thermally coupled directly to the periphery of the base plate 2a.

As described above, according to the light source unit 1 (Mode 2) shown in FIG. 15, effects similar to those of Embodiment 1 can be brought about. Also, since the fitting part 3b of the decorative cover 3 is thermally coupled directly to the base plate 2a, thermal conduction can be efficiently carried out. Also, this does not prevent that an adhesive agent intervenes between the fitting part 3b and the base plate 2a.

Figure 16:
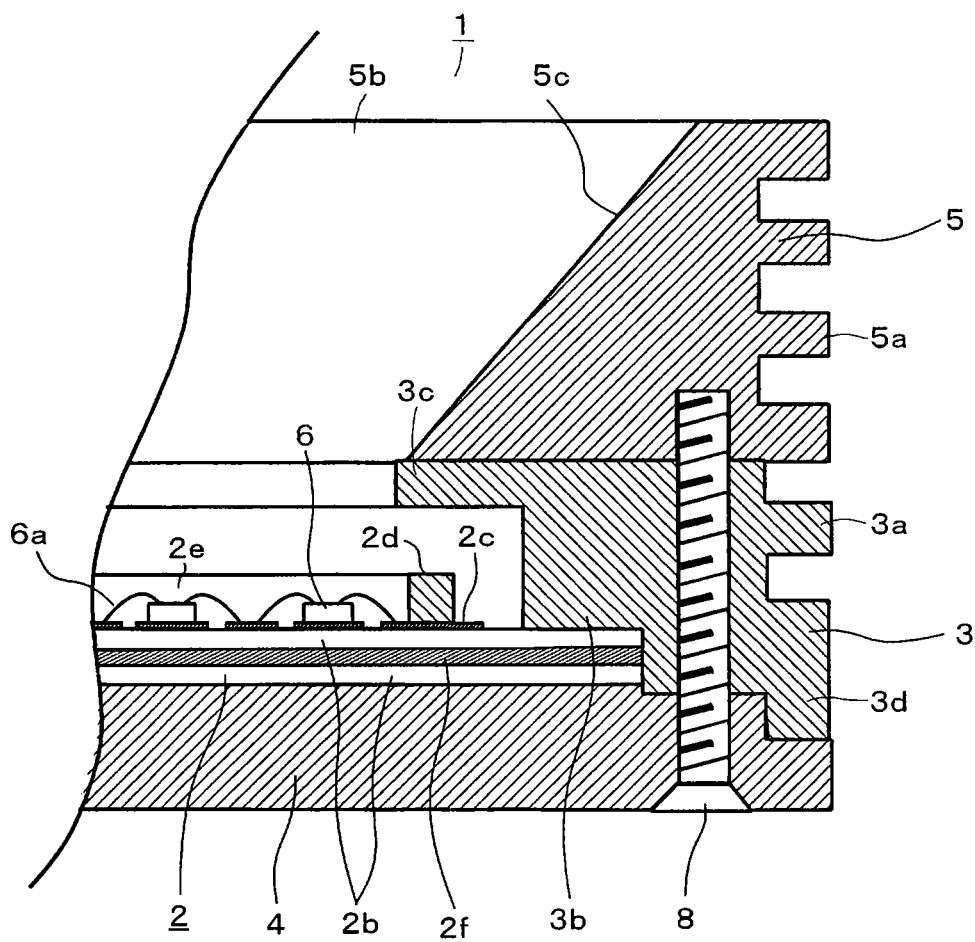

Next, referring to FIG. 16, description is given of a light source unit according to Embodiment 8 of the present invention. FIG. 16 is a sectional view showing the light source unit with a part thereof enlarged.

Embodiment 8 differs from Embodiment 7 in the configuration of the substrate 2. Briefly, Embodiment 8 is composed so that a copper foil, etc., having favorable thermal conductivity is placed between glass epoxy substrates to secure thermal conductivity.

As shown in FIG. 16, an electric insulation layer 2b composed of glass epoxy resin is formed at both the surface side and the rear side of the substrate 2, and the substrate 2 is formed with a thermal conduction layer 2f of a copper foil, etc., intervened between the electric insulation layers 2b. A circuit pattern layer 2c is formed on the electric insulation layer 2b on the surface side, and the LED chips 6 are disposed on the circuit pattern layer 2c.

As described above, according to Embodiment 8, heat generated from a plurality of LED chips 6 is mainly transmitted through the thermal conduction layer 2f from the circuit pattern area at the middle part in which the LED chips 6 are disposed, diffused to the area in the outer circumferential direction, and transmitted to the periphery. Further, the heat is thermally transmitted to the decorative cover 3 via the fitting part 3b of the decorative cover 3 and is then radiated. Therefore, effects similar to those of Embodiment 1 can be brought about, and the effect of heat radiation can be improved while securing an electric insulation property with the circuit pattern area.

In addition, as in the light source unit 1 (Mode 2) shown in FIG. 15 according to Embodiment 7, the periphery of the thermal conduction layer 2f such as a copper foil, etc., is exposed to the surface side, wherein the fitting part 3b of the decorative cover 3 and the periphery of the thermal conduction layer 2f may be thermally coupled directly to each other.

The present invention is not limited to the configurations of the respective embodiments described above, but may be subjected to various modifications and variations within the scope not departing from the spirit of the invention. The present invention is such that the decorative cover 3 having thermal conductivity is thermally coupled to the surface side of the substrate 2 having thermal conductivity, wherein although it is favorable that the heat-radiating member 4 is provided on the rear side of the substrate 2, the heat-radiating member 4 is not necessarily requisite. In addition, a ceramic substrate, etc., may be applicable as the substrate 2 in order to secure thermal conductivity. Further, a milky white light-permeable cover may be provided at the irradiation opening portion of the light source unit 1. Still further, the heat-radiating fins may be formed horizontally, vertically or obliquely with respect to the decorative cover 3 and the base surface of the reflector 5, or may be formed to be stepwise. Furthermore, there is no special restriction in regard to the forming direction and the forming shape thereof.

What is claimed is:

1. A light source unit comprising:
   a substrate comprising:
   a substrate body made of a resin having an electric insulation, the substrate body having a first surface, second surface opposite to the first surface, and a side surface between the first surface and the second surface;
      a plurality of light emitting elements mounted on the first surface; and
      a thermal conduction layer made of metal disposed only on the second surface;
      a heat-radiating body comprising:
      a plate-like metallic portion, and
      a side part metallic portion being thermally coupled to the plate-like metallic portion, covering the side surface of the substrate, and being exposed outside;
      an electric insulation layer sandwiched between the thermal conduction layer and the plate-like metallic portion; and
      a reflector made of a resin disposed on the side part metallic portion of the heat radiating body, the reflector having a reflecting surface for reflecting a light from the light emitting elements, wherein
   the plate-like metallic portion is thermally coupled to the thermal conduction layer through the electric insulation layer, and has a size larger than that of the substrate so that the plate-like metallic portion extends beyond an edge of the substrate; and
   the heat-radiating body has a heat conduction path from the plate-like metallic portion to the side part metallic portion.

2. A light source unit according to claim 1, wherein a groove is formed in an outside surface of the side part metallic portion.

3. A lighting system comprising:
   a base; and
   a light source unit according to claim 1 disposed on the base.

4. A light source unit comprising:
   a substrate comprising:
   a substrate body made of resin having an electric insulation, the substrate body having a first surface and second surface opposite to the first surface;
   a plurality of light emitting elements mounted on the first surface; and
   a thermal conduction layer made of metal disposed only on the second surface;
   a heat-radiating body disposed on the second surface of the substrate the heat radiating body comprising a plate-like metallic portion, and a side part metallic portion being thermally coupled to the plate-like metallic portion, covering a side surface of the substrate, and being exposed outside; and an electric insulation layer sandwiched between the thermal conduction layer and the heat-radiating body; and a reflector made of a resin disposed on the side part metallic portion of the heat radiating body, the reflector having a reflecting surface for reflecting a light from the light emitting elements, wherein the heat-radiating body is thermally coupled to the thermal conduction layer through the electric insulation layer, and has a size larger than that of the substrate so that the heat-radiating body extends beyond an edge of the substrate.

\* \* \* \* \*